US010425061B1

(12) United States Patent
Varela Campelo

(10) Patent No.: US 10,425,061 B1
(45) Date of Patent: Sep. 24, 2019

(54) WIRELESS COMMUNICATION CIRCUITRY

(71) Applicant: Qorvo US, Inc., Greensboro, NC (US)

(72) Inventor: José Enrique Varela Campelo, Munich (DE)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/157,168

(22) Filed: Oct. 11, 2018

(51) Int. Cl.
| | |
|---|---|
| *H04B 1/18* | (2006.01) |
| *H04B 1/00* | (2006.01) |
| *H03H 9/48* | (2006.01) |
| *H03H 1/00* | (2006.01) |
| *H04B 15/00* | (2006.01) |
| *H04B 1/12* | (2006.01) |
| *H03H 7/01* | (2006.01) |

(52) U.S. Cl.
CPC ............ *H03H 9/48* (2013.01); *H03H 1/0007* (2013.01); *H03H 7/0115* (2013.01); *H04B 1/12* (2013.01); *H04B 15/00* (2013.01); *H03H 2001/0021* (2013.01)

(58) Field of Classification Search
CPC ... H04B 1/10; H04B 1/16; H04B 1/40; H04B 1/005; H04B 1/0057; H04B 1/0458; H04B 1/0475; H04B 5/02; H04B 5/0075; H04B 7/26; H04B 15/00; H03H 7/26; H03H 7/38; H03H 7/0115; H03H 7/0138; H03H 7/0161; H03H 7/463; H03H 7/1791; H03H 9/465; H03H 9/725; H04M 11/062
USPC ........ 455/63.1, 67.13, 77, 78, 82, 83, 193.1, 455/552.1, 553.1
See application file for complete search history.

(56) References Cited

U.S. PATENT DOCUMENTS

| | | | | |
|---|---|---|---|---|
| 6,335,663 B1 * | 1/2002 | Satoh | ........................ | C03C 8/14 333/126 |
| 6,396,365 B1 * | 5/2002 | Miller | .................... | H03H 7/463 455/552.1 |
| 6,975,841 B2 * | 12/2005 | Uriu | ........................ | H03H 7/463 455/78 |

(Continued)

OTHER PUBLICATIONS

Kawai, K., et al., "RF Front-End Circuit Employing LC-Tank for Carrier Aggregation," Proceedings of the 2014 Asia-Pacific Microwave Conference, Nov. 4-7, 2014, Sendai, Japan, pp. 1049-1051.

(Continued)

*Primary Examiner* — Quochien B Vuong
(74) *Attorney, Agent, or Firm* — Withrow & Terranova, P.L.L.C

(57) ABSTRACT

Wireless communication circuitry is disclosed. The wireless communication circuitry includes an antenna terminal and an electrically conductive path between a first port terminal and the antenna terminal through a second port terminal. Also included is a bulk acoustic wave filter configured to filter and pass a desired radio frequency signal between the first port terminal and the second port terminal. Further included is a first magnetic coupling component that is electrically connected to the electrically conductive path and a resonant circuit made up of a capacitor and a second magnetic coupling component that is magnetically coupled to the first magnetic coupling component. The resonant circuit is tuned to suppress an undesired desired radio frequency signal that in some embodiments is the second harmonic of the desired radio frequency signal.

21 Claims, 10 Drawing Sheets

(56) References Cited

U.S. PATENT DOCUMENTS

| | | | | |
|---|---|---|---|---|
| 7,043,285 B2* | 5/2006 | Boyle | ............... | H03H 7/46 |
| | | | | 455/575.7 |
| 8,098,118 B2* | 1/2012 | Suwa | ............... | H01P 1/203 |
| | | | | 333/189 |
| 9,680,444 B2* | 6/2017 | Nishimura | ......... | H03H 7/463 |
| 9,838,056 B2* | 12/2017 | Wloczysiak | ......... | H04B 1/10 |

OTHER PUBLICATIONS

Li, M., et al., "A Fully Matched LTE—A Carrier Aggregation Quadplexer Based on BAW and SAW Technologies," Proceedings of the 2014 IEEE International Ultrasonics Symposium, Sep. 3-6, 2014, Chicago, Illinois, USA, pp. 77-80.

Shirakawa, A. A., et al., "A Mixed Ladder-Lattice Bulk Acoustic Wave Duplexer for W-CDMA Handsets," Proceedings of the 2007 14th IEEE International Conference on Electronics, Circuits and Systems, Dec. 11-14, 2007, Marrakech, Morocco, pp. 554-557.

* cited by examiner

WIRELESS COMMUNICATION CIRCUITRY

FIELD OF THE DISCLOSURE

The present disclosure relates to radio frequency filtering circuitry and in particular to radio frequency filtering circuitry including signal cancellation circuitry.

BACKGROUND

Acoustic resonators, and particularly bulk acoustic wave (BAW) resonators, are used in many high-frequency communication applications. In particular, BAW resonators are often employed in filter networks that operate at frequencies above 1.5 GHz and require a flat passband. Moreover, BAW resonators have exceptionally steep filter skirts and squared shoulders at the upper and lower ends of a passband. BAW resonators also provide excellent rejection outside of the passband. Further still, BAW-based filters also have relatively low insertion loss, tend to decrease in size as the frequency of operation increases, and are relatively stable over wide temperature ranges. As such, BAW-based filters are desirable for many third generation (3G) and fourth generation (4G) wireless devices and are destined to dominate filter applications for fifth generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters.

Harmonics are generated when power passes through a BAW filter. The second harmonic (H2) generation in a BAW filter is commonly referred to as "H2 self-generation." Traditional techniques to minimize H2 self-generation such as apodization and/or use of border rings may not adequately suppress H2 levels within power amplifier multiplexer networks that employ BAW-based filters. Thus, there remains a need for structures that reduce H2 levels within power amplifier multiplexer networks.

SUMMARY

Wireless communication circuitry is disclosed. The wireless communication circuitry has an antenna terminal and an electrically conductive path between a first port terminal and the antenna terminal through a second port terminal. Also included is a bulk acoustic wave (BAW) filter configured to filter and pass a desired radio frequency signal between the first port terminal and the second port terminal. Further included is a first magnetic coupling component that is electrically connected to the electrically conductive path and a resonant circuit made up of a capacitor and a second magnetic coupling component that is magnetically coupled to the first magnetic coupling component. The resonant circuit is tuned to suppress an undesired high-frequency signal passing through the wireless communication circuitry. In at least some embodiments the undesired high-frequency signal is a second harmonic of the desired radio frequency signal.

In some exemplary embodiments, the first magnetic coupling component and the BAW filter are located on a substrate with the second magnetic coupling component located in a plane above the first magnetic coupling component such that a magnetic coupling coefficient between the first magnetic coupling component and the second magnetic coupling component is from 0.4 to 1. In one such exemplary embodiment, the first magnetic coupling component and the second magnetic coupling component are both inductors.

In other exemplary embodiments, the BAW filter, the first magnetic coupling component, and the second magnetic coupling component are located coplanar on the substrate such that the magnetic coupling coefficient between the first magnetic coupling component and the second magnetic coupling component is from 0.4 to 1. In one such exemplary embodiment, the first magnetic coupling component and the second magnetic coupling component are both inductors.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 10:
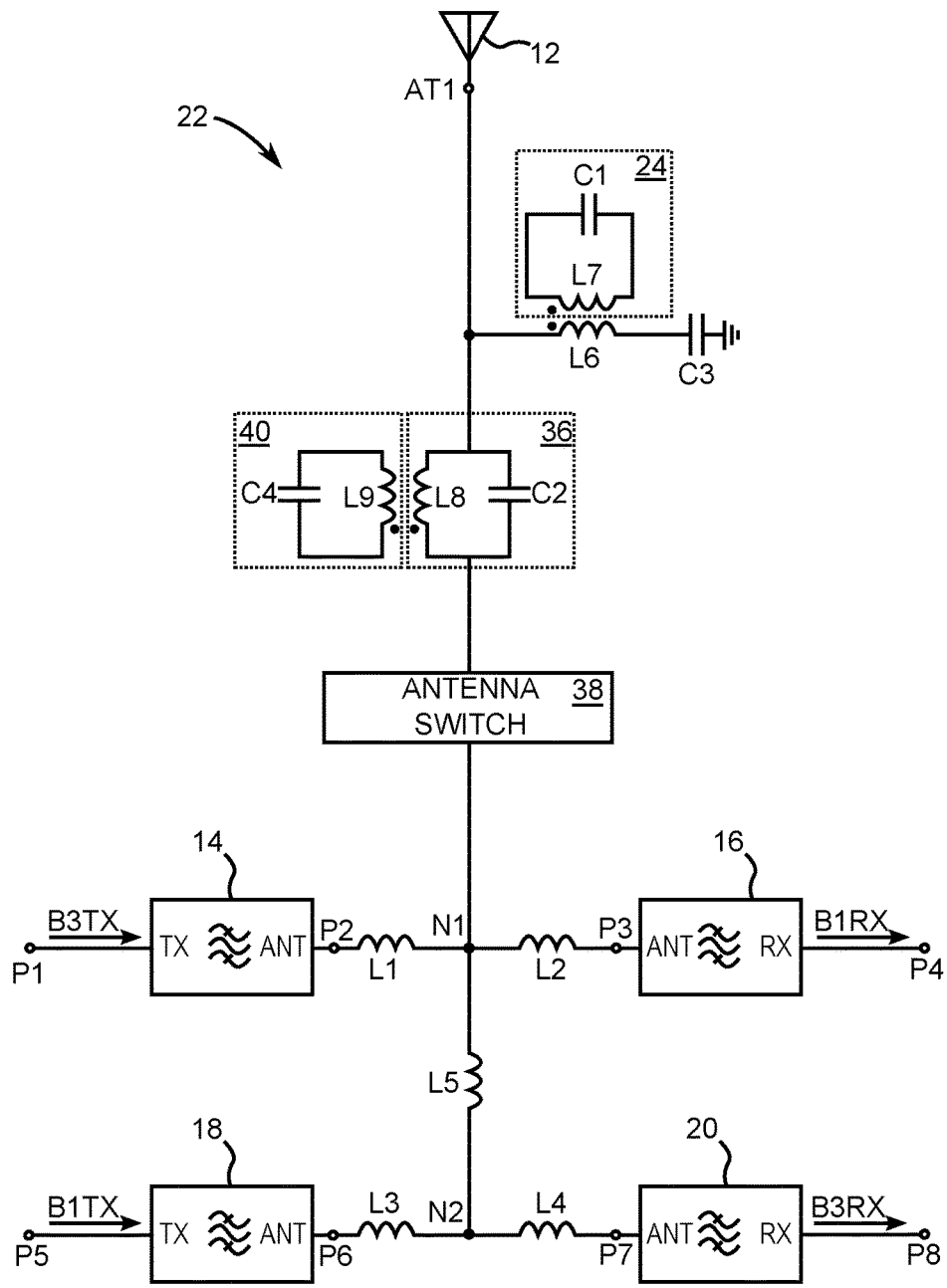

FIG. 10 is a schematic of yet another exemplary embodiment of wireless communication circuitry that includes the first resonant tank circuit that is magnetically coupled to a sixth inductor electrically coupled in shunt with the antenna, the second resonant tank circuit electrically coupled in series with the antenna, and a third resonant tank circuit magnetically coupled to the second resonant tank.

Figure 11:
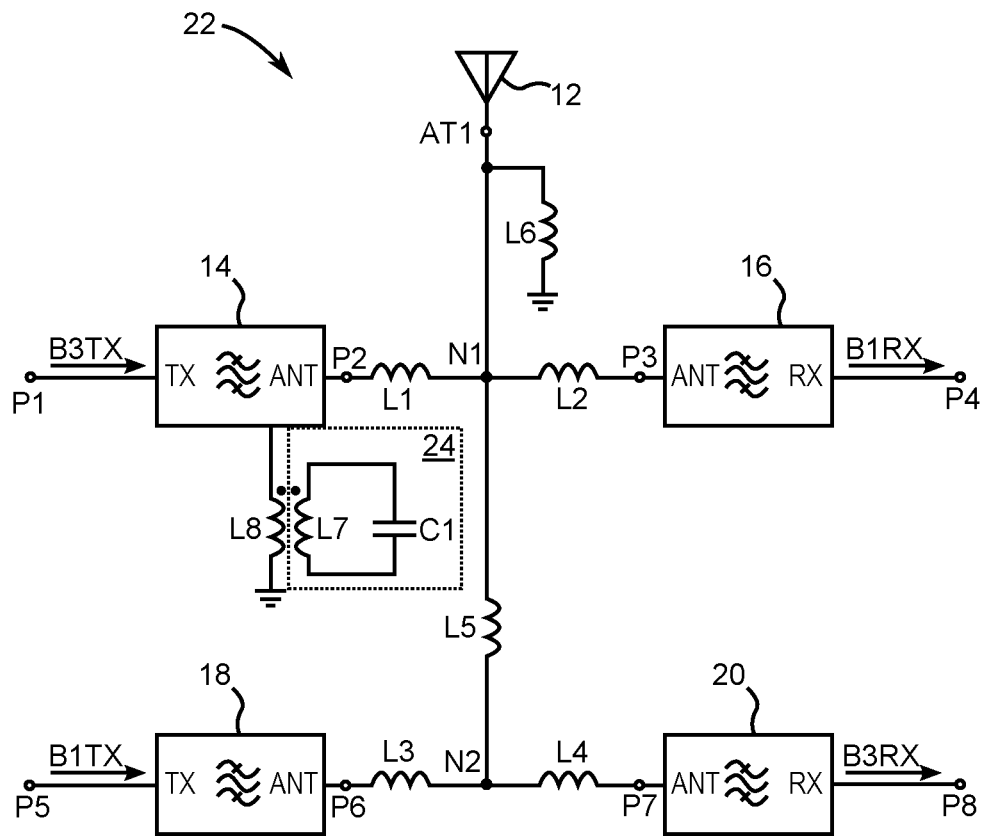

FIG. 11 is a schematic of an exemplary embodiment of wireless communication circuitry that includes a resonant tank circuit coupled in shunt with a BAW filter that filters a transmit signal.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
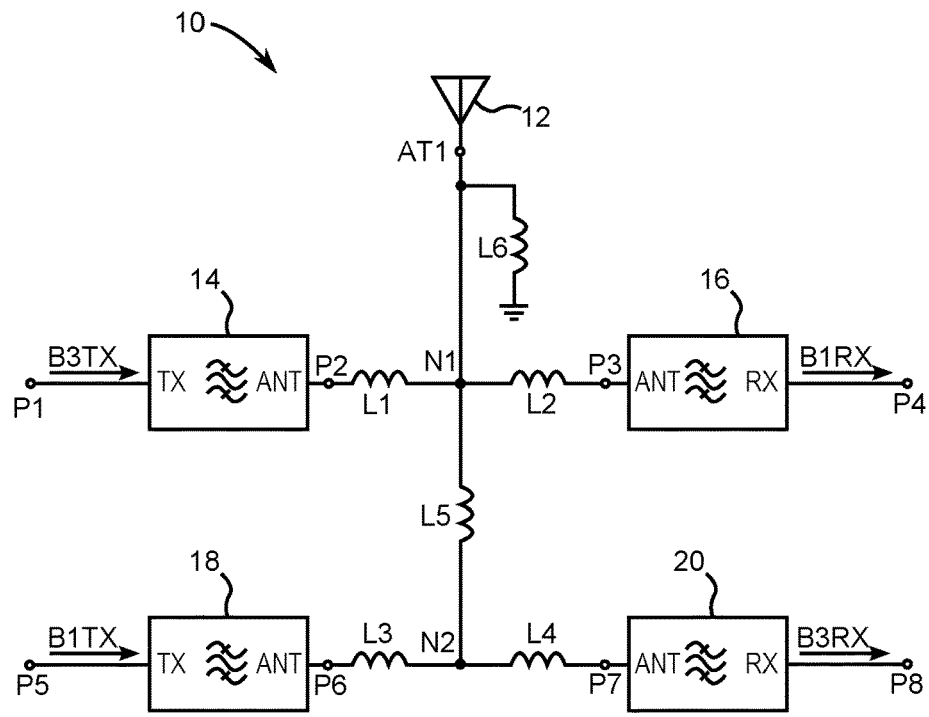
FIG. 1 is a schematic of a related-art wireless communication circuitry that is configured as a multiplexer network that includes an antenna connected to bulk acoustic wave (BAW) filters that generate undesirable second harmonics.

FIG. 1 is a schematic of a related-art wireless communication circuitry 10 that is configured as a multiplexer network that includes an antenna 12 having an antenna terminal AT1 that is electrically connected to first, second, third, and fourth bulk acoustic wave (BAW) filters 14, 16, 18, and 20, respectively. The first BAW filter 14 has a first port terminal P1 that in this example receives a band 3 transmit (B3TX) signal that is filtered by the first BAW filter 14 and output through a second port terminal P2. A first inductor L1 is electrically connected between the second port terminal P2 and a first node N1. Thus, a first electrically conductive path is provided between the first port terminal P1 and the antenna terminal AT1 through the second port terminal P2.

The second BAW filter 16 has a third port terminal P3 that in this example receives a band 1 receive (B1RX) signal from the antenna 12. The B1RX signal is filtered by the second BAW filter 16 before being output from a fourth port terminal P4. A second inductor L2 is connected between the third port terminal P3 and the first node N1. Thus, a second electrically conductive path is provided between the fourth port terminal P4 and the antenna terminal AT1 through the third port terminal P3.

The third BAW filter 18 has a fifth port terminal P5 that in this example receives a band 1 transmit (B1TX) signal that is filtered by the third BAW filter 18 and output through a sixth port terminal P6. A third inductor L3 is electrically connected between the sixth port terminal P6 and a second node N2 that is electrically coupled to the first node N1. Thus, a third electrically conductive path is provided between the fifth port terminal P5 and the antenna terminal AT1 through the sixth port terminal P6.

The fourth BAW filter 20 has a seventh port terminal P7 that in this example receives a band 3 receive (B3RX) signal from the antenna 12. The B3RX signal is filtered by the fourth BAW filter 20 before being output from an eighth port terminal P8. A fourth inductor L4 is connected between the seventh port terminal P7 and the second node N2. Thus, a fourth electrically conductive path is provided between the eighth port terminal P8 and the antenna terminal AT1 through the seventh port terminal P7.

As depicted in FIG. 1, an optional fifth inductor L5 may be electrically connected between the first node N1 and the second node N2. At least one purpose of the fifth inductor L5 is to control phase between the first node N1 and the second node N2. In other embodiments, the fifth inductor L5 may be replaced with a capacitor to correct phasing between the first node N1 and the second node N2. In yet other embodiments, the fifth inductor L5 may be eliminated such that the first node N1 and the second node N2 are the same node.

At least one purpose of the first inductor L1 and the second inductor L2 is to increase impedance at the first node N1 by canceling at least some capacitance reactance presented to the first node N1 by the first BAW filter 14 and the second BAW filter 16. Similarly, the third inductor L3 and the fourth inductor L4 increase impedance at the second node N2 by canceling at least some capacitance reactance presented to the second node by the third BAW filter 18 and the fourth BAW filter 20.

A sixth inductor L6 is electrically connected between the first node N1 and a fixed voltage node such as ground. At least one purpose of the sixth inductor L6 is to further cancel capacitive reactance of the first, second, third, and fourth BAW filters 14, 16, 18, and 20, respectively. The inductors L1 though L6 are typically fabricated from printed circuit traces.

A problem exists in that the first, second, third, and fourth BAW filters 14, 16, 18, and 20, respectively, of the wireless communication circuitry 10 produce undesirable second harmonics as they filter radio frequency signals of the radio frequency bands to which they are tuned. To meet strict wireless communication regulations and specifications, it is important to suppress the undesirable second harmonics before they radiate from the antenna 12.

Figure 2:
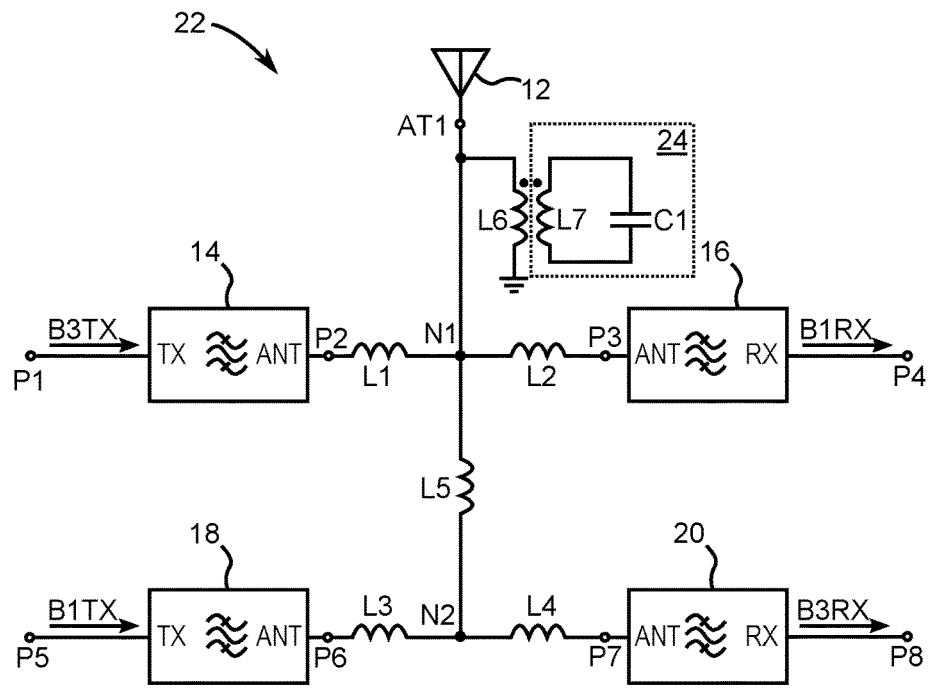
FIG. 2 is a schematic of an exemplary embodiment of wireless communication circuitry that includes the multiplexer network of FIG. 1 and in accordance with the present disclosure additionally includes a resonant tank circuit for suppressing the undesirable second harmonics and other undesirable high-frequency signals.

In this regard, FIG. 2 is a schematic of an exemplary embodiment of wireless communication circuitry 22 that in accordance with the present disclosure is configured to suppress the undesirable second harmonics generated by the first, second, third, and fourth BAW filters 14, 16, 18, and 20, respectively. In this embodiment, a seventh inductor L7 and a first capacitor C1 are electrically connected in parallel to make up a first resonant tank circuit 24. The sixth inductor L6 and the seventh inductor L7 serve as first and second magnetic coupling components so that the sixth inductor L6 and the seventh inductor L7 are magnetically coupled together. Coupling coefficients between the sixth inductor L6 and the seventh inductor L7 range from 0.4 to 0.9 in some embodiments. In other embodiments, coupling coefficients between the sixth inductor L6 and the seventh inductor L7 range from 0.6 to 0.7.

The first resonant tank circuit 24 is tuned to provide a frequency notch to suppress the undesired second harmonics that are generated by the first, second, third, and fourth BAW filters 14, 16, 18, and 20, respectively, during operation. In operation, the undesired second harmonics are suppressed at the first node N1 by selective attenuation of the undesired second harmonics by way of the first resonant tank circuit 24. Performance of the first resonant tank circuit 24 is mainly determined by the quality factor (Q) of the sixth inductor L6 and the seventh inductor L7 and the coupling coefficient between both inductors. In some embodiments, suppression of the undesired second harmonics is improved by at least 8 dB in comparison with undesired second harmonic levels attributed to the related-art wireless communication circuitry 10 of FIG. 1. In other embodiments, suppression of the undesired second harmonics is improved by at least 10 dB in comparison with undesired second harmonic levels attributed to the related-art wireless communication circuitry 10 of FIG. 1.

Figure 3:
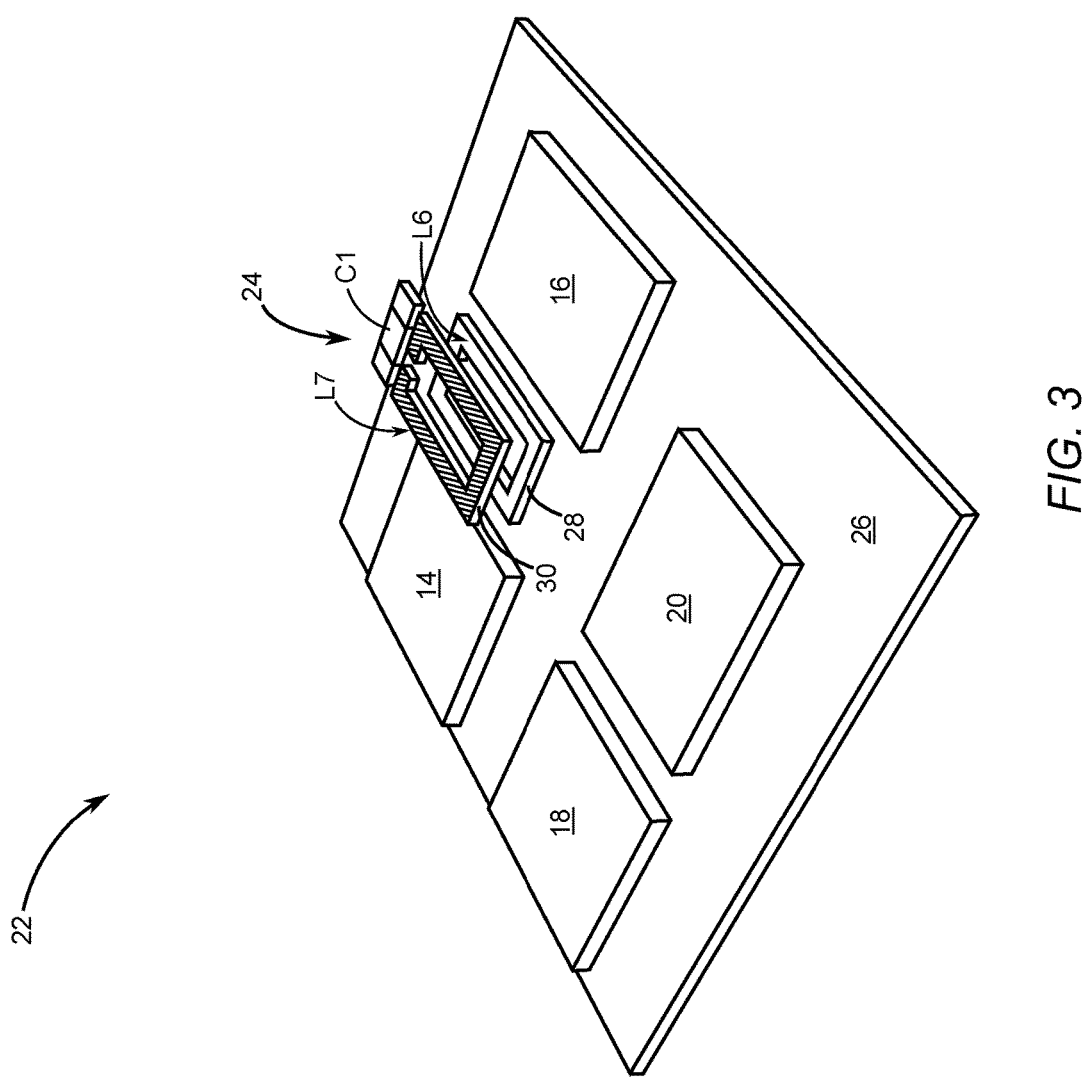
FIG. 3 is a three-dimensional view of a simplified layout of the wireless communication circuitry of FIG. 2 depicting an exemplary physical structure of the resonant tank circuit having first inductor trace(s) in a first plane magnetically coupled to second inductor trace(s) located in a second plane.

FIG. 3 is a three-dimensional view of a simplified layout of the wireless communication circuitry 22 of FIG. 2 depicting an exemplary physical structure of the first resonant tank circuit 24 relative to a laminate substrate 26. Inductors L1-L5 and the antenna 12 are not necessarily visible in this exemplary embodiment and are not depicted in FIG. 3 for the sake of clarity of the structure of the first resonant tank circuit 24. In this exemplary embodiment, at least one first inductor trace 28 making up the sixth inductor L6 is located in a first plane that is parallel with the laminate substrate 26 while at least one second inductor trace 30 making up the seventh inductor L7 is located in a second plane that is parallel with and spaced from both the laminate substrate 26 and the first plane. The capacitor C1 may be a surface mount device and may be located in the second plane with the seventh inductor L7. In this particular embodiment, the sixth inductor L6 serves at least two functions, with a first function being to cancel capacitive reactance of the first, second, third, and fourth BAW filters 14, 16, 18, and 20, respectively, combined with a second function of magnetically coupling to the seventh inductor L7 of the first resonant tank circuit 24. This at least dual function of the sixth inductor L6 provides advantages of increasing performance of the wireless communication circuitry 22 by suppressing undesirable second harmonics while minimizing real estate needed by the laminate substrate 26 to do so.

Figure 4:
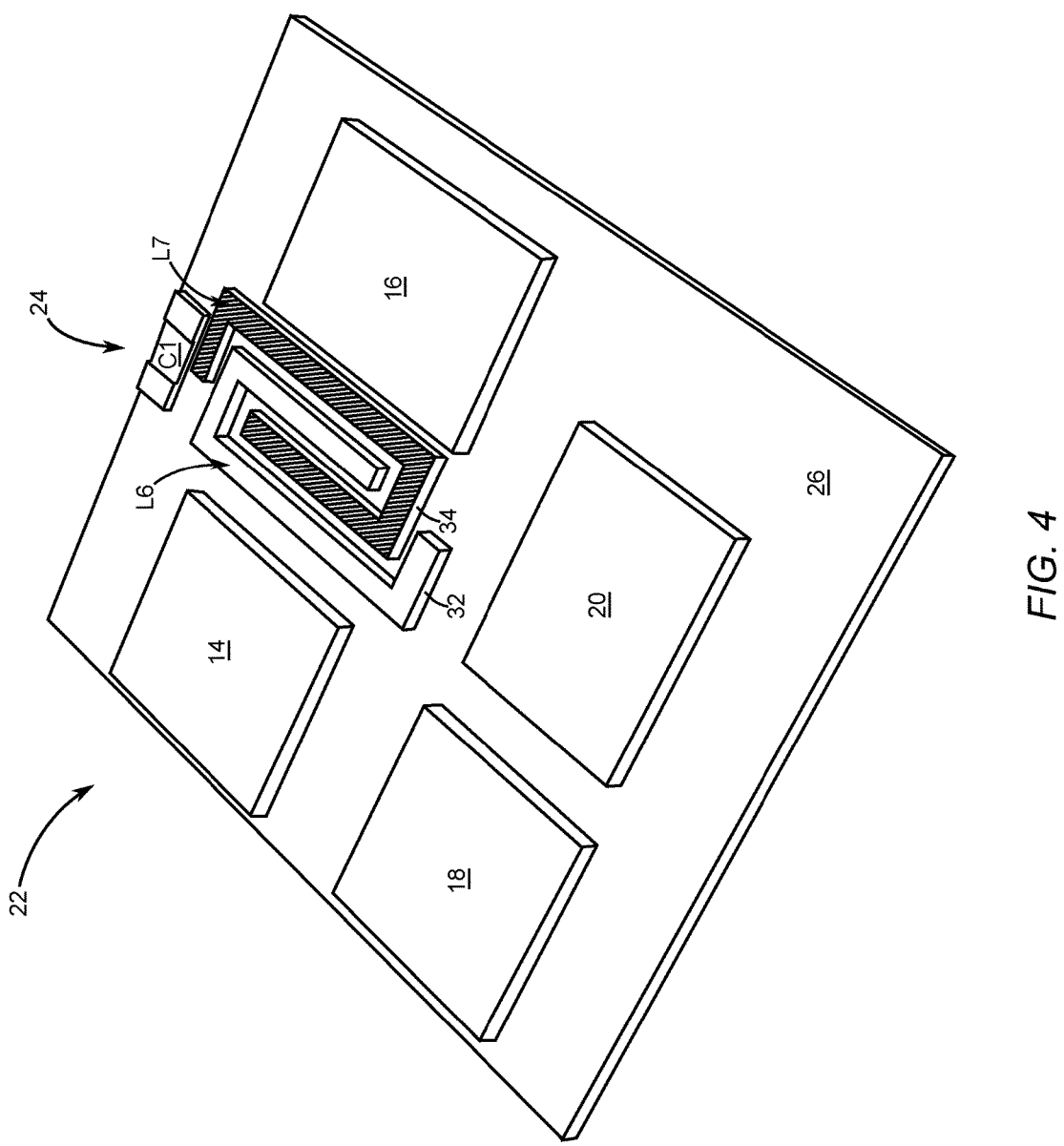
FIG. 4 is a three-dimensional view of a simplified layout of the wireless communication circuitry of FIG. 2 depicting an exemplary physical structure of the resonant tank circuit that includes first inductor trace(s) magnetically coupled to second inductor trace(s) coplanar with the first inductor trace(s).

FIG. 4 is a three-dimensional view of a simplified layout of the wireless communication circuitry 22 of FIG. 2 depicting an exemplary physical structure of the first resonant tank circuit 24 that includes at least one first inductor trace 32 that is coplanar with and magnetically coupled to at least one second inductor trace 34, both of which are coplanar with a surface of the laminate substrate 26. In this particular embodiment, the at least first inductor trace 32 makes up the sixth inductor L6 and the at least second inductor trace 34 makes up the second inductor L7. In this case the capacitor C1 is a surface mount device on a top surface of the laminate substrate 26.

Figure 5:
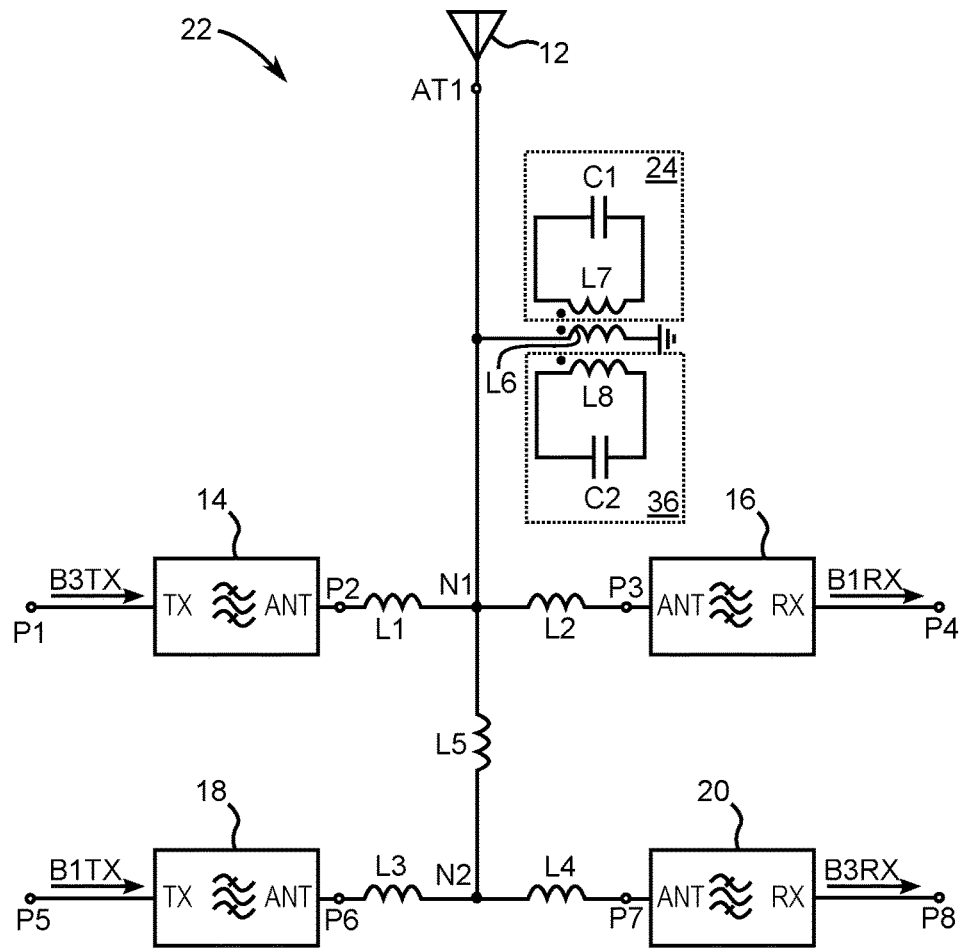
FIG. 5 is a schematic of an exemplary embodiment of wireless communication circuitry that includes an additional resonant tank circuit for additional suppression of the undesirable high-frequency signals.

FIG. 5 is a schematic of an exemplary embodiment of the wireless communication circuitry 22 that includes a second resonant tank circuit 36 for additional suppression of the undesirable second harmonics. The second resonant tank circuit 36 may be tuned to suppress a portion of the undesirable second harmonics associated with a frequency band different from another frequency band associated with the first resonant tank circuit 24. In this embodiment, an eighth inductor L8 and a second capacitor C2 are electrically connected in parallel to make up the second resonant tank circuit 36. The sixth inductor L6 and the eighth inductor L8 serve as first and third magnetic coupling components so that the sixth inductor L6 and the eighth inductor L8 are magnetically coupled together. Coupling coefficients between the sixth inductor L6 and the eighth inductor L8 range from 0.4 to 0.9 in some embodiments. In other embodiments, coupling coefficients between the sixth inductor L6 and the eighth inductor L8 range from 0.6 to 0.7. The seventh and eighth inductors L7 and L8 may or may not be magnetically coupled to each other. In some embodiments the coupling coefficient between L7 and L8 ranges from 0.1 to 0.4. In other embodiments the coupling coefficient between L7 and L8 ranges from 0.4 to 0.9.

Figure 6:
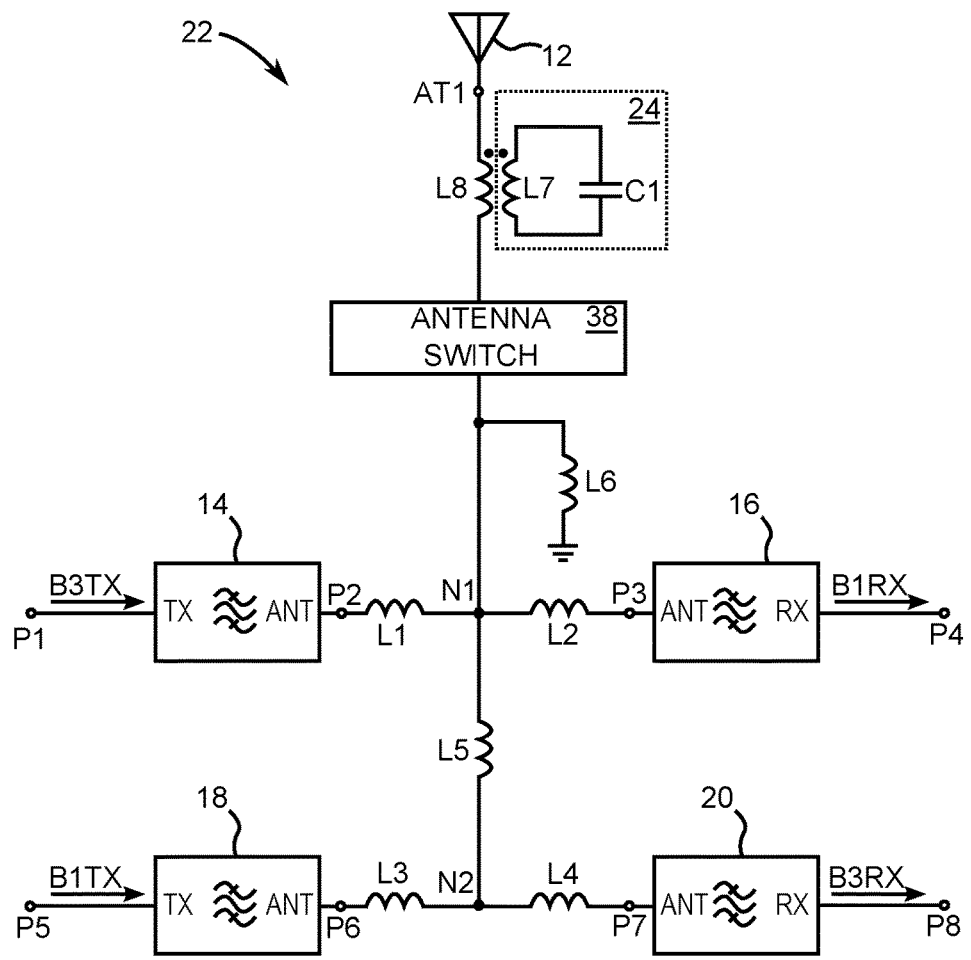
FIG. 6 is a schematic of an exemplary embodiment of wireless communication circuitry that includes a resonant tank circuit magnetically coupled to an inductor that is electrically connected in series with the antenna between the antenna and an antenna switch.

FIG. 6 is a schematic of another exemplary embodiment of the wireless communication circuitry 22 that in accordance with the present disclosure is configured to suppress the undesirable second harmonics generated by the first, second, third, and fourth BAW filters 14, 16, 18, and 20, respectively. In this embodiment, the seventh inductor L7 and the first capacitor C1 are electrically connected in parallel to make up the first resonant tank circuit 24. The eighth inductor L8 and the seventh inductor L7 are magnetically coupled together. Coupling coefficients between the seventh inductor L7 and the eighth inductor L8 range from 0.4 to 0.9 in some embodiments. In other embodiments, coupling coefficients between the seventh inductor L7 and the eighth inductor L8 range from 0.6 to 0.7. In this particular embodiment, the eighth inductor L8 is connected in series with the antenna 12. Moreover, an antenna switch 38 is connected between the first node N1 and the eighth inductor L8. The antenna switch 38 may be a stacked transistor-type switch or a microelectromechanical systems switch under control of a baseband controller (not shown).

Figure 7:
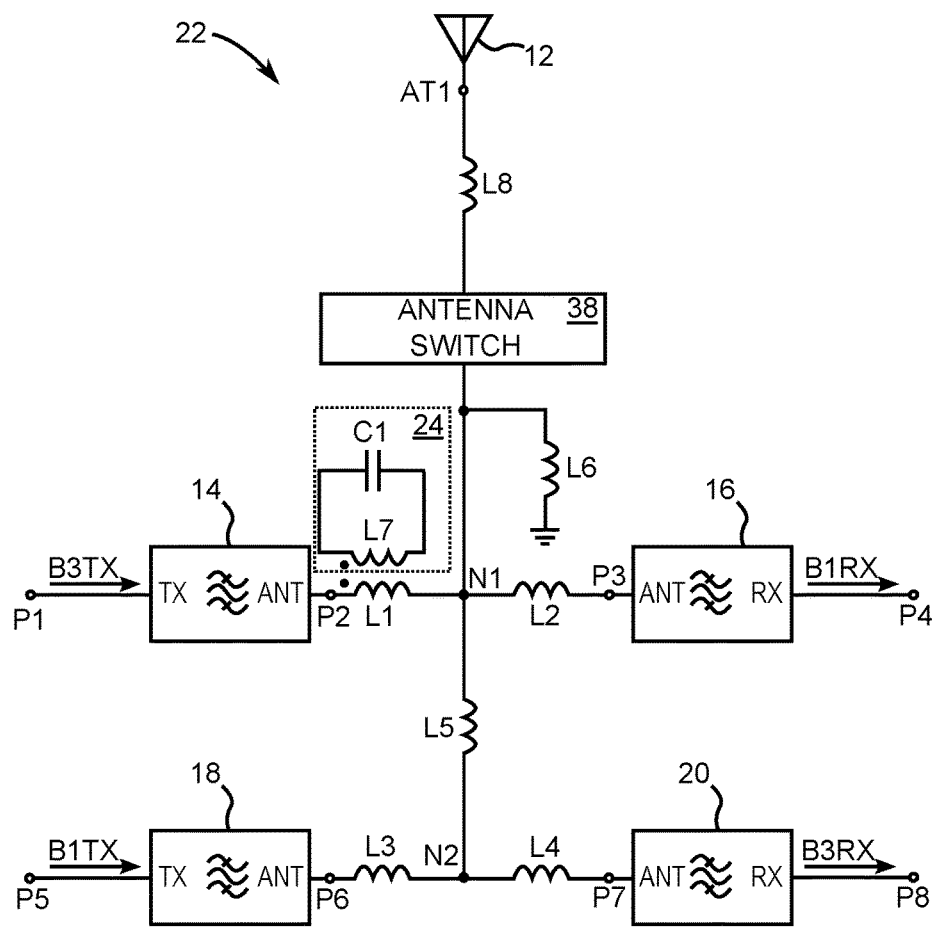
FIG. 7 is a schematic of an exemplary embodiment of wireless communication circuitry that includes a resonant tank circuit magnetically coupled to an inductor that is electrically connected to a port of a BAW filter.

FIG. 7 is a schematic of yet another exemplary embodiment of the wireless communication circuitry 22 that in accordance with the present disclosure is particularly configured to suppress the undesirable second harmonics generated by the first BAW filter 14. In this embodiment, the seventh inductor L7 and the first capacitor C1 are electrically connected in parallel to make up the first resonant tank circuit 24. The first inductor L1 and the seventh inductor L7 are magnetically coupled together. Coupling coefficients between the first inductor L1 and the seventh inductor L7 range from 0.4 to 0.9 in some embodiments. In other embodiments, coupling coefficients between the first inductor L1 and the seventh inductor L7 range from 0.6 to 0.7.

Figure 8:
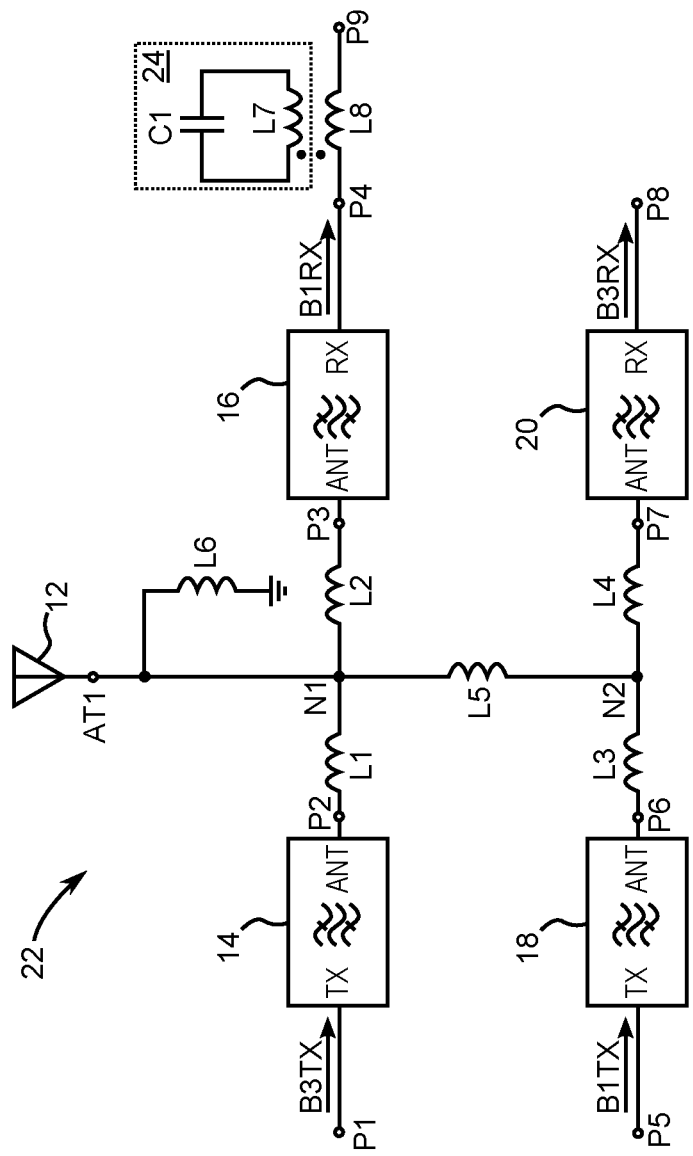
FIG. 8 is a schematic of an exemplary embodiment of wireless circuitry that includes an inductor that is electrically connected in series with a BAW filter in a receive path and a tank circuit that is magnetically coupled to the inductor to attenuate a blocker signal and avoid intermodulation distortion.

FIG. 8 is a schematic of an exemplary embodiment of wireless communication circuitry 22 that includes the eighth inductor L8 that is electrically connected in series with the second BAW filter 16 in a receive path and the first resonant tank circuit 24 that is magnetically coupled to the eighth inductor L8 to attenuate a blocker signal and avoid intermodulation distortion. In this embodiment, the seventh inductor L7 and the first capacitor C1 are electrically connected in parallel to make up the first resonant tank circuit 24. The eighth inductor L8 and the seventh inductor L7 serve as first and second magnetic coupling components so that the eighth inductor L8 and the seventh inductor L7 are magnetically coupled together. In this particular exemplary embodiment, the eighth inductor L8 is coupled between the fourth port terminal P4 and a ninth port terminal P9. In some cases, the eighth inductor L8 in this series coupled position is used as a matching element to external circuitry (not shown).

Figure 9:
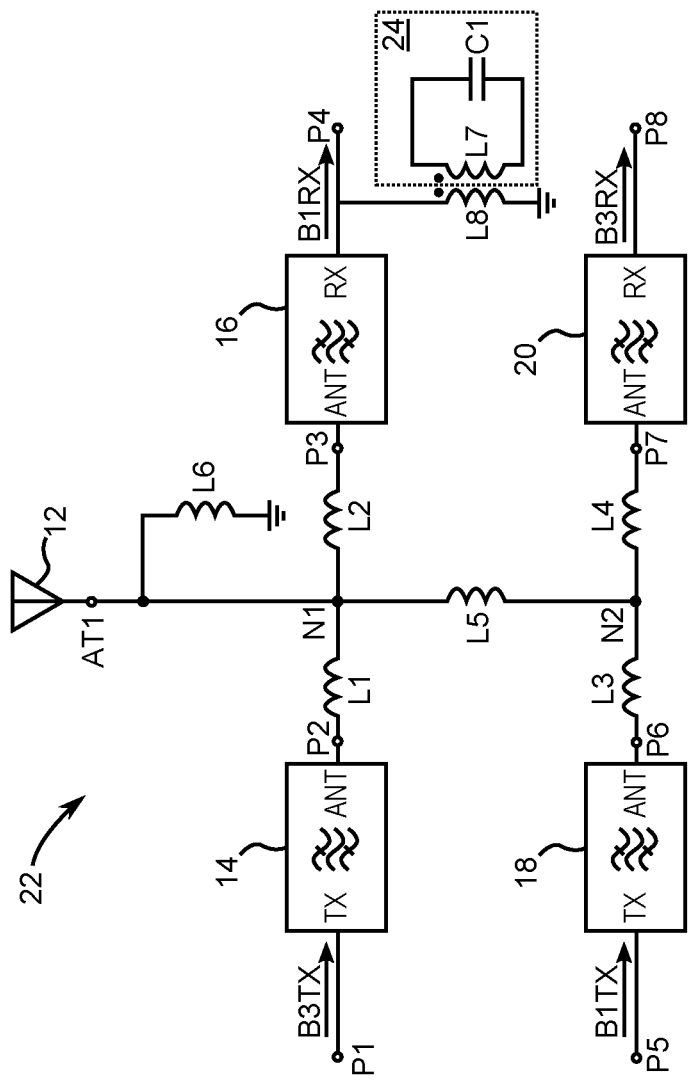
FIG. 9 is a schematic of an exemplary embodiment of wireless circuitry that includes a shunt inductor electrically coupled to a receive path that includes a BAW filter and a tank circuit that is magnetically coupled to the shunt inductor to attenuate a blocker signal, thereby avoiding intermodulation distortion.

FIG. 9 is a schematic of an exemplary embodiment of wireless circuitry 12 that includes the eighth inductor L8 electrically coupled in shunt with the receive path that includes the second BAW filter 16. The tank circuit 24 is magnetically coupled to the eighth inductor L8 to attenuate a blocker signal, thereby avoiding intermodulation distortion. In some cases, the eighth inductor L8 in this shunt position is used as a matching element to external circuitry (not shown).

FIG. 10 is a schematic of yet another exemplary embodiment of wireless communication circuitry 22 that includes the first resonant tank circuit 24 that is magnetically coupled to the sixth inductor L6 electrically connected in shunt with the antenna, the second resonant tank circuit 36 electrically coupled in series with the antenna 12, and a third resonant tank circuit 40 magnetically coupled to the second resonant tank circuit 36. A third capacitor C3 is connected in series with the sixth inductor L6. The third resonant tank circuit 40 is made up of a ninth inductor L9 electrically connected in parallel with a fourth capacitor C4. Coupling coefficients between the ninth inductor L9 and the eighth inductor L8 range from 0.4 to 0.9 in some embodiments. In other embodiments, coupling coefficients between the ninth inductor L9 and the eighth inductor L8 range from 0.6 to 0.7.

FIG. 11 is a schematic of yet another exemplary embodiment of wireless communication circuitry 22 that includes the first resonant tank circuit 24 coupled in shunt with the first BAW filter 14 that filters a transmit signal. In this particular embodiment, the eighth inductor L8 is electrically connected in shunt with the first BAW filter 14 between an internal node of the first BAW filter 14 and a fixed voltage node such as ground. In this case, the eighth inductor L8 is in the electrically conductive path between the first port terminal P1 and the antenna terminal AT1 through the second port terminal P2. It is to be understood that the resonant tank circuits of this disclosure such as first resonant tank circuit 24 may be grounded without change in performance.

Those skilled in the art will recognize improvements and modifications to the preferred embodiments of the present disclosure. All such improvements and modifications are considered within the scope of the concepts disclosed herein and the claims that follow.

What is claimed is:

1. Wireless communication circuitry comprising:
   an electrically conductive path between a first port terminal and an antenna terminal through a second port terminal;
   a bulk acoustic wave (BAW) filter configured to filter and pass a desired radio frequency signal between the first port terminal and the second port terminal;
   a first magnetic coupling component that is electrically connected to the electrically conductive path; and
   a resonant circuit comprising a capacitor and a second magnetic coupling component that is magnetically coupled to the first magnetic coupling component, wherein the resonant circuit is tuned to suppress an undesired radio frequency signal that has a different frequency from the desired radio frequency signal.

2. The wireless communication circuitry of claim 1 wherein the undesired radio frequency signal is a second harmonic of the desired radio frequency signal.

3. The wireless communication circuitry of claim 1 wherein coupling coefficients between the first magnetic coupling component and the second magnetic coupling component are from 0.4 to 0.9.

4. The wireless communication circuitry of claim 1 wherein coupling coefficients between the first magnetic coupling component and the second magnetic coupling component are from 0.6 to 0.7.

5. The wireless communication circuitry of claim 1 wherein the first magnetic coupling component is a first inductor and the second magnetic coupling component is a second inductor.

6. The wireless communication circuitry of claim 5 wherein the first inductor has at least one first inductor trace in a first plane relative to a laminate substrate comprising the BAW filter and wherein the second inductor has at least one second inductor trace in a second plane parallel to the first plane, wherein the at least one second inductor trace is adjacent to and spaced apart from the at least one first inductor trace.

7. The wireless communication circuitry of claim 5 wherein the first inductor has at least one first inductor trace in a plane relative to a laminate substrate comprising the BAW filter and wherein the second inductor has at least one second inductor trace that is coplanar with the at least one first inductor trace, wherein the at least one second inductor trace is adjacent to and spaced laterally apart from the at least one first inductor trace.

8. The wireless communication circuitry of claim 1 wherein the resonant circuit is a first resonant tank circuit with the second magnetic coupling component electrically connected in parallel with the capacitor.

9. The wireless communication circuitry of claim 8 wherein the first magnetic coupling component is electrically connected in shunt with an antenna coupled to the antenna terminal.

10. The wireless communication circuitry of claim 9 wherein the first magnetic coupling component is a first inductor and the second magnetic coupling component is a second inductor.

11. The wireless communication circuitry of claim 8 wherein the first magnetic coupling component is electrically connected in series with an antenna coupled to the antenna terminal.

12. The wireless communication circuitry of claim 8 wherein the first magnetic coupling component is electrically connected in shunt with the BAW filter.

13. The wireless communication circuitry of claim 8 further including a second resonant tank circuit comprising a third magnetic coupling component electrically connected in parallel with a third capacitor.

14. The wireless communication circuitry of claim 1 wherein the BAW filter is configured to pass the desired radio frequency signal from the second port terminal to the antenna terminal for transmission from an antenna.

15. The wireless communication circuitry of claim 1 wherein the BAW filter is configured to receive the desired radio frequency signal from an antenna.

16. The wireless communication circuitry of claim 1 further including a second resonant circuit comprising a second capacitor and a third magnetic coupling component that is magnetically coupled to the first magnetic coupling component.

17. The wireless communication circuitry of claim 16 wherein the second resonant circuit is tuned to the undesired radio frequency signal to further suppress the undesired radio frequency signal between the second port terminal and the antenna terminal.

18. The wireless communication circuitry of claim 16 wherein the second resonant circuit is a second resonant tank circuit with the third magnetic coupling component electrically connected in parallel with the second capacitor.

19. The wireless communication circuitry of claim 16 wherein the first magnetic coupling component, the second magnetic coupling component, and the third magnetic coupling component are inductors.

20. The wireless communication circuitry of claim 1 wherein the electrically conductive path is a receive path with the first magnetic coupling component being a first inductor coupled in series with the BAW filter and the second magnetic coupling component being a second inductor that is tuned with the capacitor to attenuate a blocker signal, thereby reducing intermodulation distortion.

21. The wireless communication circuitry of claim 1 wherein the electrically conductive path is a receive path with the first magnetic coupling component being a first inductor coupled in shunt with the BAW filter and the second magnetic coupling component being a second inductor that is tuned with the capacitor to attenuate a blocker signal, thereby reducing intermodulation distortion.

* * * * *